Jan. 28, 1969 A. H. EDWARDS 3,424,926
HIGH SPEED MULTIVIBRATOR
Filed April 9, 1965

Arvel Hollis Edwards
INVENTOR.

BY James O. Dixon

United States Patent Office 3,424,926
Patented Jan. 28, 1969

3,424,926
HIGH SPEED MULTIVIBRATOR

Arvel Hollis Edwards, Houston, Tex., assignor to Texas Instruments Incorporated, Dallas, Tex., a corporation of Delaware Filed Apr. 9, 1965, Ser. No. 446,933
U.S. Cl. 307—273 2 Claims
Int. Cl. H03k 3/26

ABSTRACT OF THE DISCLOSURE

A monostable multivibrator is disclosed which produces, in response to an input pulse, multiple outputs having the capability of high frequency and high duty cycle operation along with a wide range of output pulse widths.

This invention relates to multivibrators and more particularly to monostable multivibrator circuits for producing, in response to an input pulse, an output pulse having a trailing edge which is delayed from the leading edge thereof by a variable amount.

It is often necessary that a monostable multivibrator be capable of producing a wide range of output pulse widths. Moreover, there may be the requirement that when the multivibrator is producing its shortest possible output pulses, it be capable of producing such pulses in response to input pulses applied to the multivibrator with high frequency. Such high frequency capability is enhanced by providing a multivibrator in which the initiation and termination of the output pulse is accomplished at fast switching speeds. It is further enhanced if, after the termination of the ouptut pulse, the multivibrator be rapidly placed in a condition of readiness to receive a new input pulse. Such a provision of a short time between the end of the output pulse and the readiness to respond to another input pulse renders the multivibrator capable of enhanced high duty cycle operation; i.e., operation in which the output pulse width is a large fraction of the input pulse repetition period. Often, this high duty cycle operation is required of the circuit, independent of the other requirements previously mentioned. The multivibrator of the present invention provides a wide range of output pulse widths, improved high frequency capability and high duty cycle operation while employing a relatively simple and inexpensive circuit construction. The circuit also provides response to a wide range of input pulse amplitudes and make available multiple outputs of positive and negative polarities.

Therefore, it is an object of the invention to provide a multivibrator capable of improved high frequency operation.

Another object of the invention is to provide a multivibrator capable of improved high frequency and high duty cycle operation.

Another object of the invention is to provide a multivibrator with multiple outputs, having the capability both for high frequency and high duty cycle operation along with a wide range of output pulse widths.

In accordance with one aspect of the invention, there is provided in a multivibrator having two transistors and two operating states, a third transistor responsive to a change in conduction in one of said two transistors, and having its emitter connected in series with the emitter of one of said two transistors to enhance the speed of switching from one state to another. In accordance with another aspect of the invention wherein the duration of one operating state of the multivibrator is determined by a timing capacitor, there is further provided a fourth transistor, connected to one terminal of the capacitor, to conduct following the termination of the one operating state in order to ready the multivibrator to reassume the one operating state.

Other objects, features, and advantages of the invention will be more readily understood from the following detailed description when read in conjunction with the appended claims and attached drawing, in which:

Figure 1:
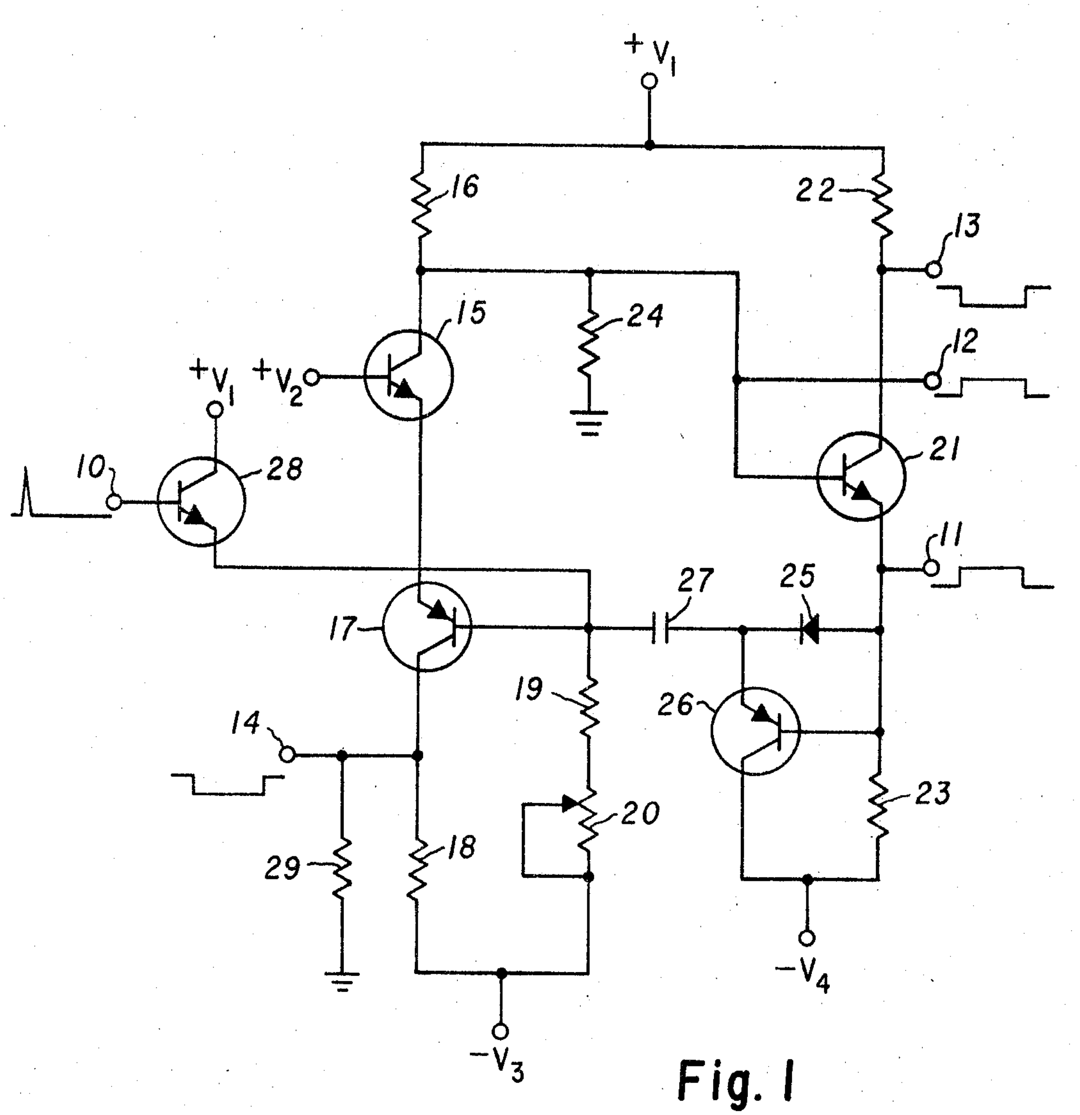
FIGURE 1 is a schematic diagram of a multivibrator according to the invention.

In the operation of the multivibrator shown in FIGURE 1, the application of a positive input pulse at input terminal 10 initiates positive output pulses at output terminals 11 and 12, and negative output pulses at terminals 13 and 14, all in time coincidence with the pulse at terminal 11. As will be explained later, the duration of the output pulses is variable. When the output pulses terminate, the multivibrator passes through a rapid transition to assume the condition in which it operated prior to the application of the input pulse at terminal 10.

Prior to the application of an input pulse at terminal 10, the multivibrator is in the following condition: NPN transistor 15, having its collector connected to a source of positive potential $+V_1$ through load resistor 16, is maintained in saturation by the smaller constant positive potential $+V_2$ applied at its base. Connecting the emitter of transistor 15 to a source of constant negative potential $-V_3$ is PNP transistor 17. Transistor 17 is connected to the emitter of transistor 15 by its own emitter, and by its collector to $-V_3$ through load resistor 18. The potential at the emitter of transistor 17, which is equal to $+V_2$ minus the minute base-emitter voltage of transistor 15, is sufficient to maintain transistor 17 also in saturation. The emitter-to-base current of transistor 17 flows through fixed resistor 19 and variable resistor 20 to the source of potential $-V_3$.

Also, prior to the application of an input pulse at terminal 10, NPN transistor 21 is conducting because of the positive voltage present at the collector of transistor 15. For the purposes of the invention, the multivibrator of the drawing could just as well be modified to make transistor 21 nonconducting during this period, but preferably it should not be permitted to operate in saturation at this time. Sources of power for transistor 21 are the source $+V_1$ connected to its collector through load resistor 22 and a source of negative potential $-V_4$ connected to its emitter through resistor 23. The base drive for transistor 21 is the collector voltage of transistor 15, which is applied across resistor 24, connected from the collector of transistor 15 to ground.

Also prior to the application of the input pulse to terminal 10, diode 25 and transistor 26 are not conducting. At the junction of the cathode of diode 25 and one terminal of capacitor 27, the voltage is substantially the emitter voltage of transistor 21. At the other capacitor terminal the potential is less than $+V_2$ by the combined base-emitter voltages of transistors 15 and 17. The potential at input terminal 10 is sufficiently low, prior to the application of the input pulse, that transistor 28 is not conducting.

The positive input pulse applied at terminal 10 must be sufficient to drive transistor 17 toward cut-off until, as set forth below, feedback from transistor 21 also begins to turn transistor 17 off. A pulse raising the transistor 17 base voltage somewhat above $+V_2$ is satisfactory in this respect.

When the positive input pulse is applied to terminal 10, it is applied by emitter-follower transistor 28 to the base of transistor 17, reducing the current through transistor 17. Since the emitter current of transistor 17 is the emitter current of transistor 15, the latter transistor also undergoes a reduction in current flow. Because of the reduction of current through transistor 15, there is a rise in the voltage at its collector. This rise, applied to the base of transistor 21, causes a like rise in voltage at the emitter thereof, which is applied by diode 25 and capacitor 27 back to the base of transistor 17.

In comparing the operation of transistors 17 and 15 with that of the one transistor, common-emitter stage commonly employed in multivibrators, the rise of the voltage at the collector of transistor 15, in response to the voltage applied at the base of transistor 17, is much more rapid than would be the rise of the collector voltage in a common-emitter stage. Transistor 15 is arranged in a common base configuration. Transistor 17 is in an emitter follower circuit. Both the common base and emitter follower circuits are faster responding circuits than is the common emitter circuit; the arrangement of the two circuits in the multivibrator of FIGURE 1 preserves the speeds of the individual circuits to produce a combination which is faster than the common emitter circuit. Transistor 15 is not used without transistor 17 because it is desirable that the capacitor charging circuit of the multivibrator drive the base of transistor 17, which presents sufficient impedance to the charging circuit that it draws little current therefrom. If the charging circuit were driving the emitter of transistor 15 instead, the lower impedance presented at that emitter would draw substantially more current. Transistor 17 is not used without transistor 15 because its emitter follower configuration does not provide sufficient voltage gain to sustain the operation of the multivibrator. Transistor 15 provides the needed voltage gain.

The exceptionally fast response of transistor 15 to the voltage applied at the base of transistor 17 causes the output pulses of the multivibrator to exhibit high speed in the transitions from the one voltage level thereof to the other. The resulting of obtaining such high speed transitions is to make shorter the minimum width possible for an output pulse produced by the multivibrator. The shortening of the minimum possible pulse width allows the multivibrator to respond to input pulses at terminal 10 which are more closely spaced from each other in time. Thus, in fulfillment of one object of the invention, the multivibrator is made capable of high frequency operation.

Such action further reduces the current through transistor 17, and the action continues until both transistors 15 and 17 are cut off, at which time, the potential applied to the base of transistor 21 becomes a fraction of $+V_1$, which fraction is determined by the values of resistors 16 and 24 and the input impedance characteristics at the base of transistor 21. The potential at output terminal 11 is almost equal to the base voltage of transistor 21, being less only by the negligible transistor 21 base-emitter voltage. Resistors 16 and 24 are selected so that the potential at terminal 11 is larger than the potential at the base of transistor 17, thereby enabling capacitor 27 to begin charging through the path composed of diode 25, capacitor 27, resistors 19 and 20 and the source of potential $-V_3$. At the instant charging begins, there has been negligible change in the voltage across capacitor 27; hence, except for the small voltage drop across diode 25, the terminal 11 voltage is applied in full to the base of transistor 17. The application of the terminal 11 voltage to the base of transistor 17 not only serves to turn off said transistor 17 as described above, but also to isolate the source of the input pulse from the base thereof, the potential at terminal 11 being chosen sufficiently large with respect to that at terminal 10 to cut off transistor 28. As capacitor 27 begins to charge, the potential at the terminal thereof connected to diode 25 remains at a substantially fixed value, approximately equal to the collector voltage of transistor 15, while the voltage at the other capacitor terminal begins to decrease from that fixed value toward $-V_3$.

During the time that capacitor 27 is charging, the value of the output potential at terminal 14 is a fraction of $-V_3$ which is determined by the values of resistor 29 (connected from the transistor 17 collector to ground) and resistor 18. The value of the output potential at terminal 13, on the other hand, is determined by the collector current of transistor 21 and load resistor 22. The output potential at terminal 12 is the potential at the base of transistor 21, previously described.

Since the voltage at terminal 11 is greater than that at the cathode of diode 25, the base-emitter junction of transistor 26 is back-biased; therefore, transistor 26 does not conduct while capacitor 27 is charging.

When the voltage at the base of transistor 17 decreases sufficiently with respect to $+V_2$ to cause transistors 15 and 17 to begin conducting again, the output pulses of the multivibrator terminate, and the circuit begins to resume the condition in which it operated prior to the application of the input pulse to terminal 10. It is the adjustment of resistor 20, controlling the time constant of the capacitor 27 charging circuit, which controls the amount of delay between the leading and trailing edges of the output pulses. Of course, the time constant could as well be controlled by the value of capacitor 27. Alternatively, resistors 19 and 20 might be replaced by a constant source which charges capacitor 27 with a constant current of selectable magnitude.

As soon as transistors 15 and 17 turn on, the transistor 15 collector (output terminal 12) voltage drops back to its initial value, thereby causing the current through transistor 21 to decrease and the potentials at terminals 11 and 13 to resume the values which they had prior to the application of the input pulse. Since transistor 17 is again conducting the voltage at terminal 14 likewise assumes its initial value.

Once the voltage at the base of transistor 17 has decreased sufficiently by the charging of capacitor 27 to turn on said transistor, said voltage decreases no further, being held by the source $+V_2$ at a value slightly less than $+V_2$. The value of the potential at the opposite terminal of capacitor 27 (the cathode of diode 25) just after transistors 15 and 17 have switched back into operation is the same as when said transistors are off, the unilateral conduction of diode 25 isolating the cathode of the diode from terminal 11. In order to lower the voltage at the cathode of diode 25 to the value at terminal 11 and thereby ready the multivibrator to receive another input pulse, capacitor 27 must discharge. This it does rapidly by means of transistor 26. As indicated, the potential at the cathode of diode 25 is higher than that at terminal 11; hence the base-emitter junction of transistor 26 is forward-biased. The collector-base junction is back-biased by the voltage drop across resistor 23. When capacitor 27 has sufficiently discharged through transistor 26 so that the voltage across diode 25 no longer forward-biases the base-emitter junction of transistor 26, transistor 26 cuts off, and the multivibrator is ready to receive a new input pulse.

The operation of transistor 26 in quickly discharging capacitor 27 insures that there will be only a short period after the termination of the multivibrator output pulses before the circuit is ready to produce a new output pulse in response to a new input pulse. If a new input pulse is applied immediately as the circuit becomes ready to receive it, the output voltage waveforms of the multivibrator exhibit only a small time between the termination of one output pulse and the beginning of the next. Under these circumstances, when the output pulses are long, there is exhibited a high duty cycle. When they are short, the small discharge time contributes to the ability of the multivibrator to respond to input pulses closely spaced in time. Thus, in fulfillment of an object of the invention, the high frequency and high duty cycle capabilities of the multivibrator are enhanced. Further, a wide variety of output pulse widths is possible, since in the multivibrator of the invention, the use of a circuit with a slow charging time does not drastically affect the length of the discharging time, the latter time having been made so much shorter than the former.

Figure 2:
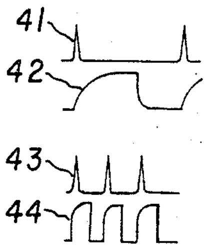
FIGURE 2 is an illustrative comparison of the operation of the circuit in FIGURE 1 with the operation of a prior art circuit.

FIGURE 2 illustrates the contrast between the input and ouput waveforms of a multivibrator according to the present invention and those of a multivibrator having lesser high frequency capabilities.

Waveform 41 shows input voltage pulses applied to a multivibrator having as its active elements only two transistors. The waveform 42 is representative of the shortest output voltage pulse such a multivibrator can produce—about 60 nanoseconds in duration.

After the termination of the output pulse, the timing capacitor is restored in about 40 nanoseconds to a condition wherein the multivibrator is capable of responding to another input pulse. Thus, the circuit having as its output waveform 42 cannot respond to input pulses occurring more frequently than once each 100 nanoseconds.

The waveforms 43 and 44 are representative of input and output voltage waveforms of the multivibrator of FIGURE 1. The output pulse in waveform 44 is 20 nanoseconds long. At the termination of the output pulse, the circuit is restored, in 10 nanoseconds more, to a condition capable of responding to another input pulse. Thus, in contrast to the slower multivibrator, the circuit of FIGURE 1 can respond to input pulses applied once each 30 nanoseconds.

It is to be understood that the above-described embodiment is merely illustrative of the application of the principles of the invention. Numerous other arrangements may be devised by those skilled in the art without departing from the spirit and scope of the invention as defined by the appended claims.

What is claimed is:

1. A multivibrator comprising:

means including first and second complementary transistors, with the emitters thereof connected in series for producing a change in the current through said emitters in response to a signal applied at an input terminal of said second transistor, means including a third transistor driven by said first transistor for producing a variation in the collector current of said third transistor in response to said change, capacitor means coupling an output terminal of said third transistor with said input terminal of said second transistor for augmenting said change in response to said variation, and for causing a displacement current in said capacitor means until the charge on said capacitor effects an alteration of the current through said emitters in opposition to said change, diode means connected to one terminal of said capacitor means to form a series circuit therewith, thereby to cause an interruption of the current through said series circuit, in response to said alteration of said current, and means including a fourth transistor connected by a terminal thereof to said one terminal of said capacitor means for conducting a current in response to said interruption of said current, thereby to restore said change to the condition thereof prior to said signal.

2. A multivibrator comprising:

a first transistor with a source of fixed potential at the base thereof to maintain said transistor normally conducting, a second transistor of conductivity type opposite to said first transistor and having the emitter thereof connected to the emitter of said first transistor in series conducting relationship, said second transistor being responsive to a pulse at the base thereof to cut off the current through said emitters, a third transistor driven at the base terminal thereof by said first transistor to increase the collector current therethrough when said first transistor is cut off, a diode connected by one terminal thereof to an output terminal of said third transistor, a capacitor connected from the other terminal of said diode to the base of said second transistor, responsive to said increased collector current for accumulating a charge thereon to again render said second transistor conductive, and means including a fourth transistor connected to said other terminal of said diode responsive to the resumption of conduction in said second transistor to restore the charge on said capacitor to the condition thereof prior to said pulse.

References Cited

UNITED STATES PATENTS

| | | | |
|---|---|---|---|
| 2,948,820 | 8/1960 | Bothwell | 307—273 |
| 3,016,468 | 1/1962 | Moraff | 307—273 |
| 3,133,210 | 5/1964 | Leurgans | 307—293 |
| 3,135,878 | 6/1964 | Eagle | 307—293 |
| 3,231,765 | 1/1966 | Martin et al. | 307—293 |

JOHN S. HEYMAN, *Primary Examiner.*

U.S. Cl. X.R.

307—265, 288